United States Patent
You

(10) Patent No.: US 9,666,270 B2
(45) Date of Patent: May 30, 2017

(54) NONVOLATILE MEMORY SYSTEM AND SEQUENTIAL READING AND PROGRAMMING METHODS THEREOF

(71) Applicant: SK hynix Inc., Gyeonggi-do (KR)

(72) Inventor: Byoung-Sung You, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/960,117

(22) Filed: Dec. 4, 2015

(65) Prior Publication Data
US 2016/0372186 A1    Dec. 22, 2016

(30) Foreign Application Priority Data
Jun. 18, 2015   (KR) ........................ 10-2015-0086469

(51) Int. Cl.
G11C 11/56   (2006.01)
G06F 3/06    (2006.01)
G11C 16/10   (2006.01)
G11C 16/34   (2006.01)
G11C 16/04   (2006.01)

(52) U.S. Cl.
CPC .......... G11C 11/5642 (2013.01); G06F 3/061 (2013.01); G11C 16/107 (2013.01); *G11C 11/5628* (2013.01); *G11C 16/0483* (2013.01); *G11C 16/3454* (2013.01)

(58) Field of Classification Search
CPC ... G06F 3/061; G11C 16/107; G11C 11/5628; G11C 11/5642; G11C 16/3454
See application file for complete search history.

(56) References Cited

U.S. PATENT DOCUMENTS

| 2006/0155896 | A1* | 7/2006 | Lee | ..................... | G11C 16/3454 710/52 |
| 2009/0040836 | A1* | 2/2009 | Lee | ..................... | G11C 16/3454 365/185.22 |
| 2013/0135934 | A1* | 5/2013 | Kim | ..................... | G11C 11/5621 365/185.18 |
| 2014/0351487 | A1* | 11/2014 | Kim | ..................... | G11C 16/107 711/103 |
| 2016/0011779 | A1* | 1/2016 | Lee | ........................ | G06F 3/061 711/103 |

FOREIGN PATENT DOCUMENTS

| KR | 1020050112988 | 12/2005 |
| KR | 1020070023174 | 2/2007 |
| KR | 1020070107414 | 11/2007 |
| KR | 1020100007714 | 1/2010 |

* cited by examiner

*Primary Examiner* — Douglas King
*Assistant Examiner* — Ajay Ojha
(74) *Attorney, Agent, or Firm* — IP & T Group LLP

(57) ABSTRACT

A nonvolatile memory device includes a multi-level cell which stores M-bit data at a time and M number of latches for respectively storing M-bit data on a single bit basis. A controller sequentially latches M-bit data of the multi-level cell into the M number of latches, respectively, during a first half read period, and sequentially outputs the latched M-bit data in the M number of latches during a second half read period.

6 Claims, 18 Drawing Sheets

FIG. 13D

| | Time frame | Sequence |
|---|---|---|
| LSB READ PREPARATION | Initial Data Setting | A |
| | XDEC (PUMP on) | B |
| | PUMP | C |
| | Common Setting | D |
| LSB READ | Unit Sensing Operation (LSB) | E-1 |
| | PMP Discharge to RB# High | F |
| CSB READ PREPARATION | Initial Data Setting | A |
| | XDEC (PUMP on) | B |
| | PUMP | C |
| | Common Setting | D |
| CSB READ | Unit Sensing Operation (CSB) | E-2 |
| | PMP Discharge to RB# High | F |
| MSB READ PREPARATION | Initial Data Setting | A |
| | XDEC (PUMP on) | B |
| | PUMP | C |
| | Common Setting | D |
| MSB READ | Unit Sensing Operation (MSB) | E-3 |
| | PMP Discharge to RB# High | F |

FIG. 16

| Time frame | Sequence | Remarks |
|---|---|---|
| Initial Data Setting | A | |
| XDEC (PUMP on) | B | |
| PUMP | C | |
| Common Setting | D | |
| Unit Sensing Operation (LSB) | E-1 | |
| Unit Sensing Operation (CSB) | E-2 | |
| Unit Sensing Operation (MSB) | E-3 | |
| PMP Discharge to RB# High | F | |

READ PREPARATION: Initial Data Setting, XDEC (PUMP on), PUMP, Common Setting
LSB READ: Unit Sensing Operation (LSB)
CSB READ: Unit Sensing Operation (CSB)
MSB READ: Unit Sensing Operation (MSB)

NONVOLATILE MEMORY SYSTEM AND SEQUENTIAL READING AND PROGRAMMING METHODS THEREOF

CROSS-REFERENCE TO RELATED APPLICATION

This application claims priority under 35 U.S.C. §119 to Korean Patent Application No. 10-2015-0086469 filed on Jun. 18, 2015 in the Korean Intellectual Property Office, the disclosure of which is incorporated herein by reference in its entirety.

TECHNICAL FIELD

Exemplary embodiments relate to a semiconductor design technology, and more particularly, to data input/output operations of a nonvolatile memory system including multi-level cells.

DISCUSSION OF THE RELATED ART

The computer environment paradigm has shifted to ubiquitous computing systems that can be used anytime and anywhere. Thus, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption since they have no moving parts. Examples of data storage devices having such advantages include universal serial bus (USB) memory devices, memory cards having various interfaces, and solid state drives (SSD).

SUMMARY

Various embodiments are directed to a nonvolatile memory system capable of programming multi-bit data in each mufti-level cell through a single program operation and reading multi-bit data from each multi-level cell through a single read operation, and a method for operating the same.

In an embodiment, a nonvolatile memory system may include a nonvolatile memory device including a multi-level cell which stores M-bit data, M being an integer equal to or greater than 3 at a time and M number of latches for respectively storing M-bit data on a single bit basis; and a controller suitable for sequentially latching M-bit data of the multi-level cell into the M number of latches, respectively, during a first half read period, and sequentially outputting the latched M-bit data in the M number of latches during a second half read period.

In a program operation, the controller may latch M-bit data provided from a host into the M number of latches, respectively, during a first half program period, and sequentially program the latched M-bit data in the M number of latches into the multi-level cell during a second half program period.

The M number of latches may include a main latch suitable for latching each of the M-bit data to be inputted/outputted to/from the multi-level cell; a cache latch suitable for latching each of the M-bit data to be inputted/outputted to/from an input/output circuit; and M minus 2 number of auxiliary latches electrically suitable for latching one of bits of the M-bit data latched in the main latch or the cache latch.

In the first half read period, the controller may sequentially latch each of M-bit data into the main latch on a single bit basis, and latch each of the M-bit data, which is previously latched in the main latch, into one of the cache latch and the M minus 2 number of auxiliary latches. The controller may sequentially output the latched M-bit data in the M number of latches during the second half read period after all M-bit data is latched in the M number of latches.

In the second half read period, the controller may move each of the M-bit data latched in one of the main latch and the M minus 2 number of auxiliary latches to the cache latch on a single bit basis each time each of the M-bit data previously latched in the cache latch is outputted through the input/output circuit, thereby sequentially outputting the total M-bit data through the input/output circuit on a single bit basis.

A nonvolatile memory system may include a first nonvolatile memory device including a first multi-level cell which stores M-bit data, M being an integer equal to or greater than 3 at a time and M number of first latches for respectively storing M-bit data on a single bit basis; a second nonvolatile memory device including a second multi-level cell which stores N-bit data, N being an integer equal to or greater than 3 at a time and N number of second latches for respectively storing N-bit data on a single bit basis; and a controller suitable for: sequentially latching M-bit data of the multi-level cell into the M number of first latches, respectively, during a first half read period of the first nonvolatile memory device, and sequentially outputting the latched M-bit data in the M number of first latches during a second half read period of the first nonvolatile memory device, and sequentially latching N-bit data of the multi-level cell into the N number of second latches, respectively, during a first half read period of the second nonvolatile memory device, and sequentially outputting the latched N-bit data in the N number of second latches during a second half read period of the second nonvolatile memory device. The controller may control the first and second nonvolatile memory devices in a pipelining way such that the second half read period of the first nonvolatile memory device and the first half read period of the second nonvolatile memory device overlaps with each other.

The controller may latch M-bit data provided from a host into the M number of first latches, respectively, during a first half program period of the first nonvolatile memory device, and sequentially program the latched M-bit data in the M number of first latches into the multi-level cell during a second half program period of the first nonvolatile memory device. The controller may latch N-bit data provided from the host into the N number of second latches, respectively, during a first half program period of the second nonvolatile memory device, and sequentially program the latched N-bit data in the N number of second latches into the multi-level cell during a second half program period of the second nonvolatile memory device. The controller may control the first and second nonvolatile memory devices in a pipelining way such that the second half program period of the first nonvolatile memory device and the first half program period of the second nonvolatile memory device overlaps with each other.

The M number of first latches may include a first main latch suitable for latching each of the M-bit data to be inputted/outputted to/from the first multi-level cell; a first cache latch suitable for latching each of the M-bit data to be inputted/outputted to/from an first input/output circuit; and M minus 2 number of first auxiliary latches electrically suitable for latching one of bits of the M-bit data latched in the first main latch or the first cache latch.

The N number of second latches may include a second main latch suitable for latching each of the N-bit data to be inputted/outputted to/from the second multi-level cell; a second cache latch suitable for latching each of the N-bit data to be inputted/outputted to/from an second input/output circuit; and N minus 2 number of second auxiliary latches electrically suitable for latching one of bits of the N-bit data latched in the second main latch and the second cache latch.

During the first half read period of the first nonvolatile memory device, the controller may sequentially latch each of M-bit data into the first main latch on a single bit basis, and latch each of the M-bit data, which is previously latched in the first main latch, into one of the first cache latch and the M minus 2 number of first auxiliary latches. The controller may sequentially output the latched M-bit data in the M number of first latches during the second half read period of the first nonvolatile memory device after all M-bit data is latched in the M number of first latches of the first nonvolatile memory device.

During the first half read period of the second nonvolatile memory device, the controller may sequentially latch each of N-bit data into the second main latch on a single bit basis, and latch each of the N-bit data, which is previously latched in the second main latch, into one of the second cache latch and the M minus 2 number of second auxiliary latches. The controller may sequentially output the latched N-bit data in the N number of second latches during the second half read period of the second nonvolatile memory device after all M-bit data is latched in the M number of first latches of the second nonvolatile memory device.

During the second half read period of the first nonvolatile memory device, the controller may move each of the M-bit data latched in one of the first main latch and the M minus 2 number of first auxiliary latches to the first cache latch on a single bit basis each time each of the M-bit data previously latched in the first cache latch is outputted through the first input/output circuit, thereby sequentially outputting the total M-bit data through the first input/output circuit on a single bit basis. During the second half read period of the second nonvolatile memory device, the controller may move each of the N-bit data latched in one of the second main latch and the M minus 2 number of second auxiliary latches to the second cache latch on a single bit basis each time each of the N-bit data previously latched in the second cache latch is outputted through the second input/output circuit, thereby sequentially outputting the total N-bit data through the second input/output circuit on a single bit basis.

A method for operating a nonvolatile memory system having a nonvolatile memory device including a multi-level cell which stores M-bit data, M being an integer equal to or greater than 3 at a time and M number of latches for respectively storing M-bit data on a single bit basis may include sequentially latching M-bit data of the multi-level cell into the M number of latches, respectively, during a first half read period; and sequentially outputting the latched M-bit data in the NI number of latches during a second half read period.

The method may further include latching M-bit data provided from a host into the M number of latches, respectively, during a first half program period and sequentially programming the latched M-bit data in the M number of latches into the multi-level cell during a second half program period.

The M number of latches may include a main latch suitable for latching each of the M-bit data to be inputted/outputted to/from the multi-level cell; a cache latch suitable for latching each of the M-bit data to be inputted/outputted to/from an input/output circuit; and M minus 2 number of auxiliary latches electrically suitable for latching one of bits of the M-bit data latched in the main latch or the cache latch.

The sequentially latching during the first half read period sequentially may latch each of M-bit data into the main latch on a single bit basis, and latch each of the M-bit data, which is previously latched in the main latch, into one of the cache latch and the M minus 2 number of auxiliary latches. The sequentially outputting during the second half read period may be performed after all M-bit data is latched in the M number of latches.

The sequentially outputting during the second half read period may move each of the M-bit data latched in one of the main latch and the M minus 2 number of auxiliary latches to the cache latch on a single bit basis each time each of the M-bit data previously latched in the cache latch is outputted through the input/output circuit, thereby sequentially outputting the total M-bit data through the input/output circuit on a single bit basis.

A method for operating a nonvolatile memory system having first and second nonvolatile memory devices may include sequentially latching M-bit data of a multi-level cell into a M number of first latches, respectively, during a first half read period of the first nonvolatile memory device, and sequentially outputting the latched M-bit data in the M number of first latches during a second half read period of the first nonvolatile memory device, and sequentially latching N-bit data of a multi-level cell into a N number of second latches, respectively, during a first half read period of the second nonvolatile memory device, and sequentially outputting the latched N-bit data in the N number of second latches during a second half read period of the second nonvolatile memory device. The sequentially latching and outputting of the M-bit data and the sequentially latching and outputting N-bit data may be performed in a pipelining way such that the second half read period of the first nonvolatile memory device and the first half read period of the second nonvolatile memory device overlaps with each other.

The M number of first latches may include a first main latch suitable for latching each of the M-bit data to be inputted/outputted to/from the multi-level cell; a first cache latch suitable for latching each of the M-bit data to be inputted/outputted to/from a first input/output circuit; and M minus 2 number of first auxiliary latches electrically table for latching one of bits of the M-bit data latched in the first main latch or the first cache latch.

The N number of second latches may include a second main latch suitable for latching each of the M-bit data to be inputted/outputted to/from the multi-level cell; a second cache latch suitable for latching each of the M-bit data to be inputted/outputted to/from a second input/output circuit; and N minus 2 number of second auxiliary latches electrically suitable for latching one of bits of the M-bit data latched in the second main latch or the second cache latch.

BRIEF DESCRIPTION OF THE DRAWINGS

FIG. 13D is a schematic diagram illustrating the normal read operation and the cache read operation of the memory system.

FIG. 16 is a schematic diagram illustrating a one shot read operation of the memory system in accordance with an embodiment of the present invention.

DETAILED DESCRIPTION

Figure 1:
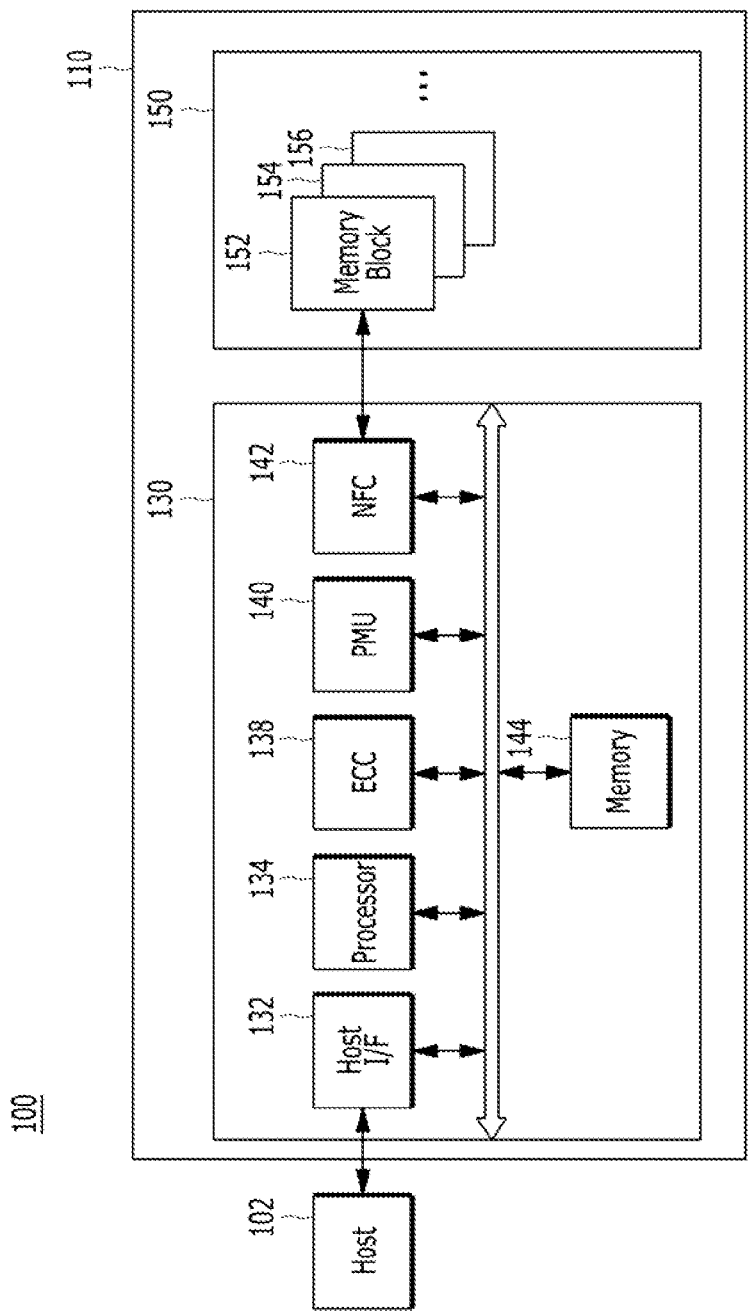
FIG. 1 is a diagram illustrating a data processing system including a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a data processing system including a memory system in accordance with an embodiment.

Referring to FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory card 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

Furthermore, the memory system 110 may configure a computer, an ultra-mobile PC (UMPC) a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, and/or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. As such, the controller 130 may control overall operations of the memory device 150, such as read, write, program and erase operations.

In detail, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (DATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and the ECC unit 138 may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130 (e.g., power for the component elements included in the controller 130).

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, as well as a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, (e.g., a NAND flash memory), a program failure may occur during the write operation (e.g., during the program operation) due to characteristics of a NAND logic function. During the bad block management, the data of the program-failed memory block or the bad memory block may be programmed into a new memory block. Also, the bad blocks seriously deteriorate the utilization efficiency of the memory device 150 having a 3D stack structure and the reliability of the memory system 100, and thus reliable bad block management is required.

Figure 2:
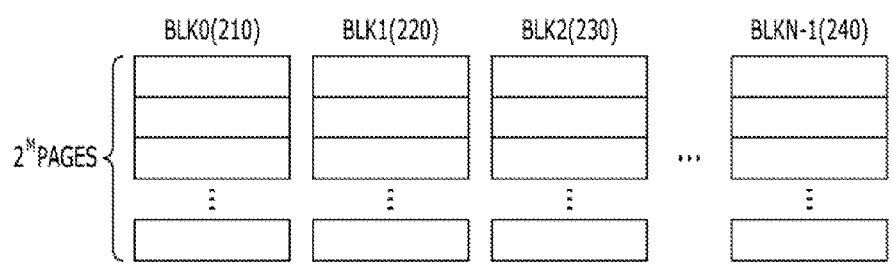
FIG. 2 is a diagram illustrating a memory device in a memory system.

FIG. 2 is a schematic diagram illustrating the memory device 150 shown in FIG. 1.

Referring to FIG. 2, the memory device 150 may include a plurality of memory blocks (e.g. zeroth to $(N-1)^{th}$ blocks 210 to 240). Each of the plurality of memory blocks 210 to 240 may include a plurality of pages (e.g., $2^M$ number of pages ($2^M$ PAGES)) to which the present invention is not limited. Each of the plurality of pages may include a plurality of memory cells to which a plurality of word lines are electrically coupled.

The memory device 150 also includes a plurality of memory blocks, as single level cell (SIC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data (e.g., two or more-bit data). An MLC memory block including a plurality of pages which are implemented with memory cells that are each capable of storing 3-bit data may be defined as a triple level cell (TLC) memory block.

Each memory block 210 to 240 stores the data provided from the host device 102 during a write operation, and provides stored data to the host 102 during a read operation.

Figure 3:
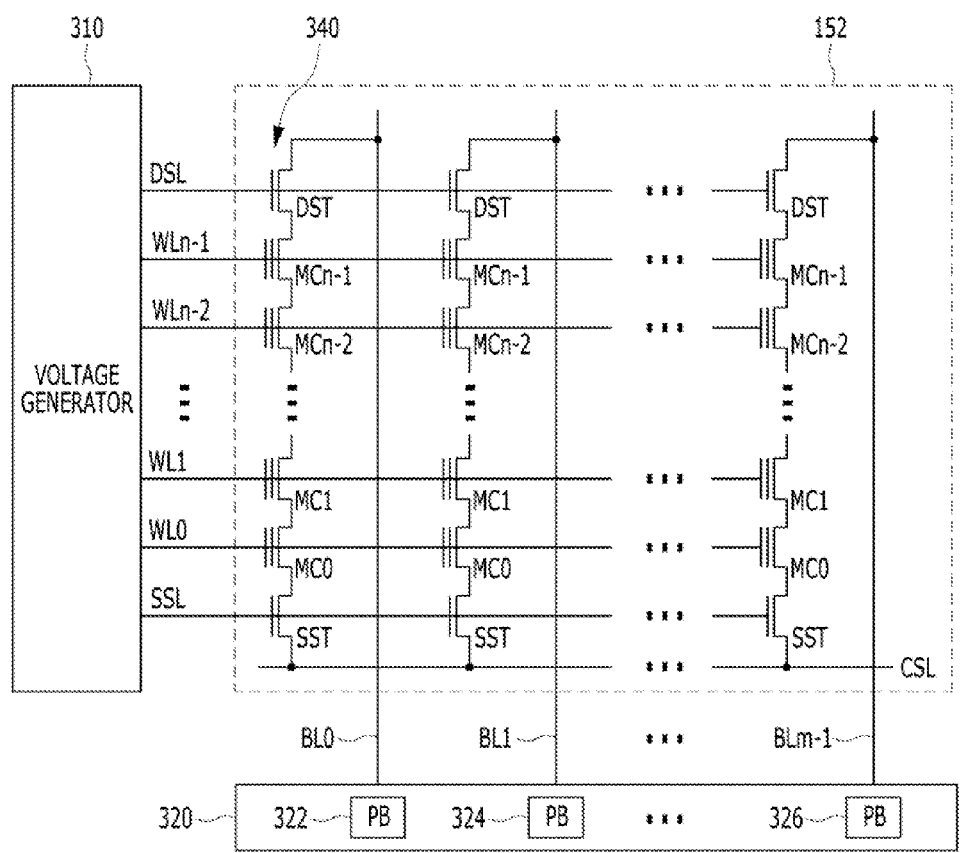
FIG. 3 is a circuit diagram illustrating a memory block in a memory device in accordance with an embodiment.

FIG. 3 is a circuit diagram illustrating one of the plurality of memory blocks 152 to 156 shown in FIG. 1.

Referring to FIG. 3, the memory block 152 of the memory device 150 may include a plurality of cell strings 340 which are electrically coupled to bit lines BL0 to BLm−1 respectively. The cell string 340 of each column may include at least one drain select transistor DST and at least one source select transistor SST. A plurality of memory cells or a plurality of memory cell transistors MC0 to MCn−1 are electrically coupled in series between the select transistors DST and SST. The respective memory cells MC0 to MCn−1 are configured by multi-level cells (MLC), each of which stores data information of a plurality of bits. The strings 340 are electrically coupled to the corresponding bit lines BL0 to BLm−1. For reference, in FIG. 3, 'DSL' denotes a drain select line, 'SRL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 provides word line voltages (e.g., a program voltage, a read voltage and/or a pass voltage) to be supplied to respective word lines according to an operation mode and provides voltages to be supplied to bulks (e.g., well regions in which the memory cells are formed). The voltage supply block 310 may perform a voltage generating operation under the control of a control circuit (not shown). The voltage supply block 310 generates a plurality of variable read voltages to generate a plurality of read data, selects one of the memory blocks or sectors of a memory cell array under the control of the control circuit, selects one of the word lines of the selected memory block, and provides the word line voltages to the selected word line and unselected word lines.

A read/write circuit 320 of the memory device 150 is controlled by the control circuit, and serves as a sense amplifier or a write driver according to an operation mode. During a verification/normal read operation, the read/write circuit 320 serves as a sense amplifier for reading data from the memory cell array. Also, during a program operation, the read/write circuit 320 serves as a write driver that drives bit lines according to data to be stored in the memory cell array. The read/write circuit 320 receives data to be written in the memory cell array from a buffer (not shown) during the program operation, and drives the bit lines according to the inputted data. The read/write circuit 320 may include a plurality of page buffers 322, 324 and 326 respectively corresponding to columns (or bit lines) or pairs of columns (or pairs of bit lines). A plurality of latches (not shown) are included in each of the page buffers 322, 324 and 326.

FIGS. 4 to 11 are schematic diagrams illustrating the memory device 150 shown in FIG. 1.

Figure 4:
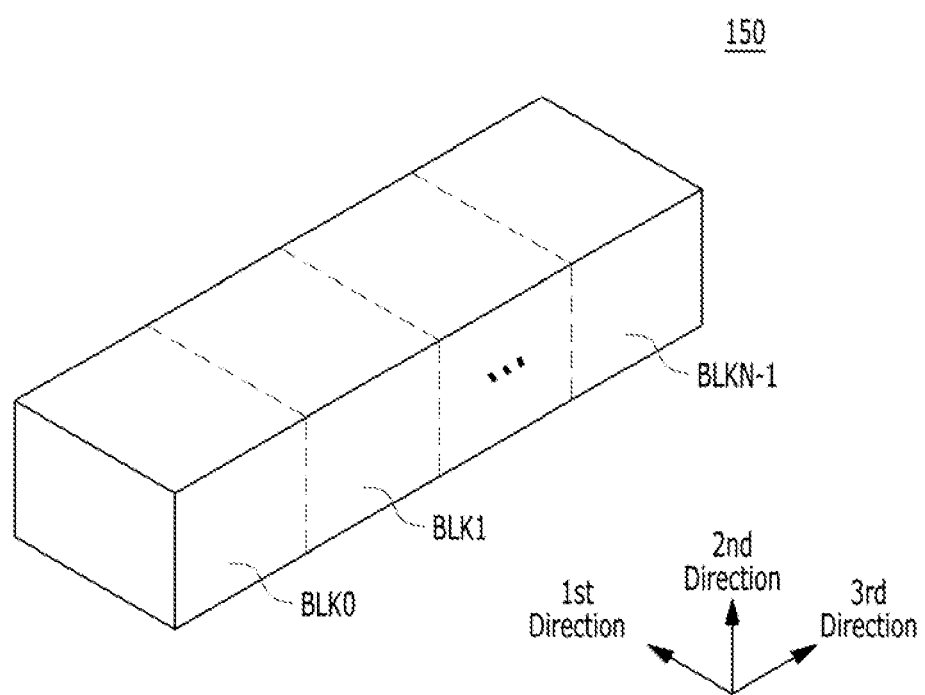
FIGS. 4, 5, 6, 7, 8, 9, 10, and 11 are diagrams schematically illustrating a memory device.

FIG. 4 is a block diagram illustrating an example of the plurality of memory blocks 152 to 156 of the memory device 150 shown in FIG. 1.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. The respective memory blocks BLK0 to BLKN−1 may include structures which extend in first to third directions (e.g. an x-axis direction, a y-axis direction and a z-axis direction).

The respective memory blocks BLK0 to BLKN−1 may include a plurality of NAND strings NS which extend in the second direction. The plurality of NAND strings NS may be provided in the first direction and the third direction. Each NAND string NS is electrically coupled to a bit line BL, at least one source select line SSL, at least one ground select line GSL, a plurality of word lines WL, at least one dummy word line DWL, and a common source line CSL. Namely, the respective memory blocks BLK0 to BLKN−1 are electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
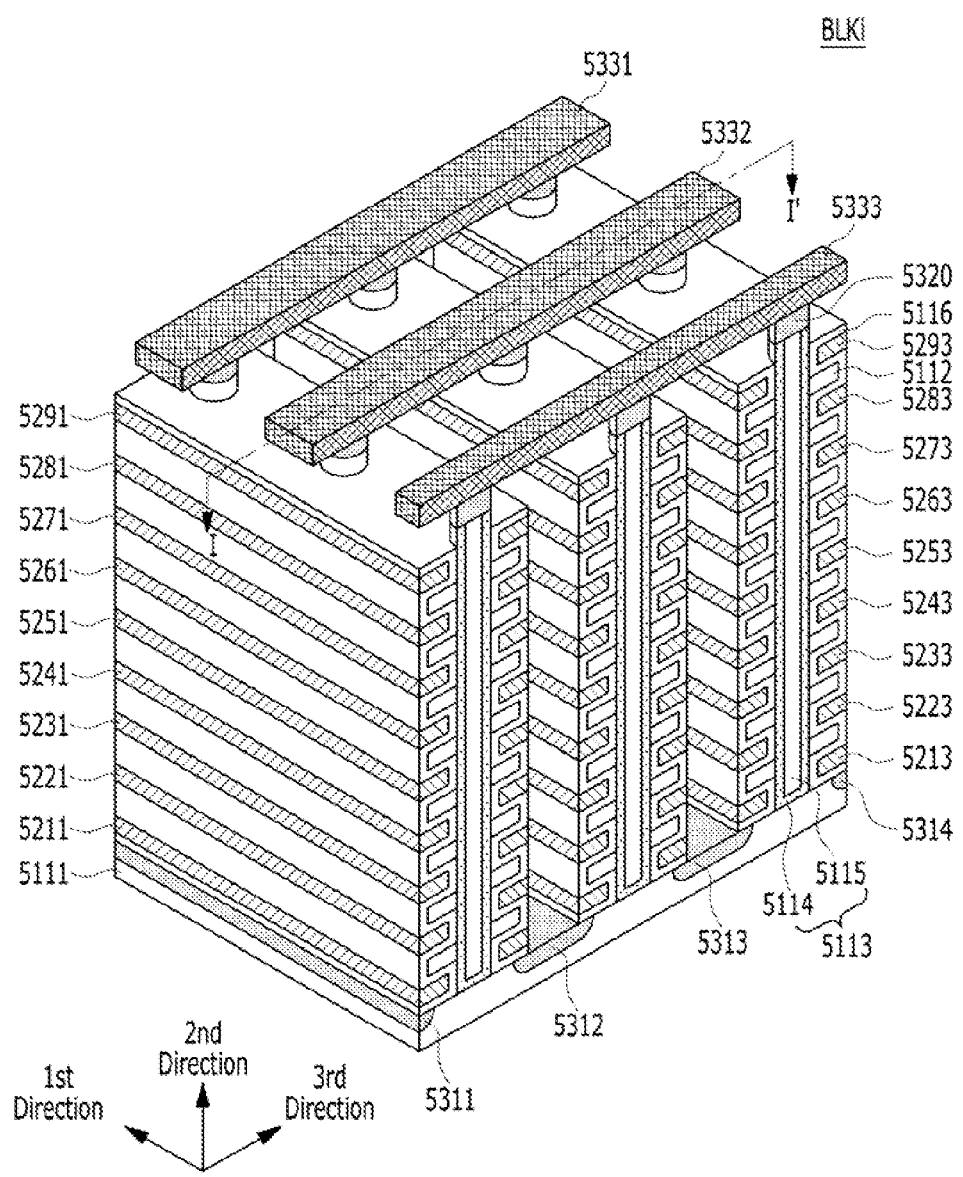
Figure 6:
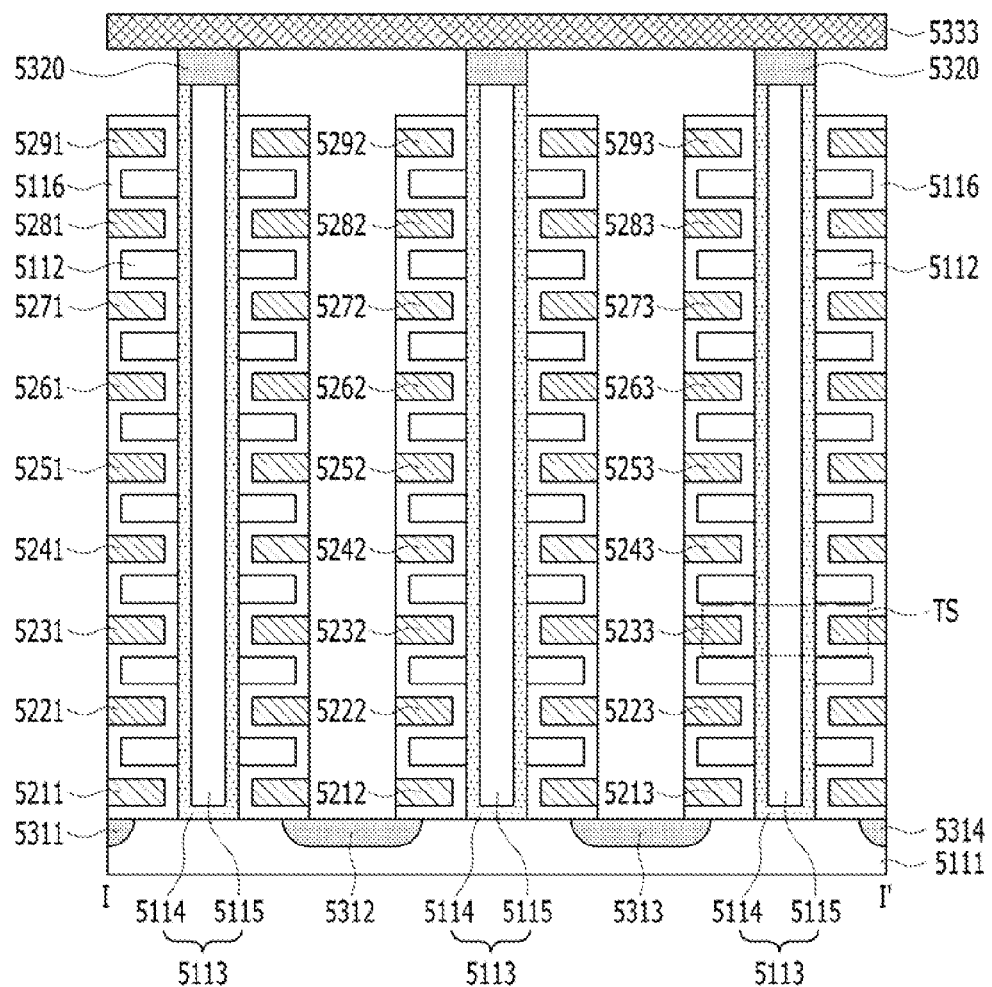

FIG. 5 is an isometric view of one BLKi of the plural memory blocks BLK0 to BLKN−1 shown in FIG. 4. FIG. 6 is a cross-sectional view taken along a line I-I' of the memory block. BLKi shown in FIG. 5.

Referring to FIGS. 5 and 6, a memory block BLKi among the plurality of memory blocks of the memory device 150 may include a structure which extends in the first to third directions.

A substrate 5111 is provided. The substrate 5111 may include a silicon material doped with a first type impurity. The substrate 5111 may include a silicon material doped with a p-type impurity or may be a p-type well (e.g., a pocket p-well) and include an n-type well which surrounds the p-type well. While it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (i) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as the structures between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed that the drains 5320 include n-type silicon, it is to be noted that the drains 5320 are not limited to being n-type silicon. For example, the width of each drain 5320 may be greater than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled through contact plugs. The conductive materials 5331 to 5333 which extend in the third direction may be a metallic material. The conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
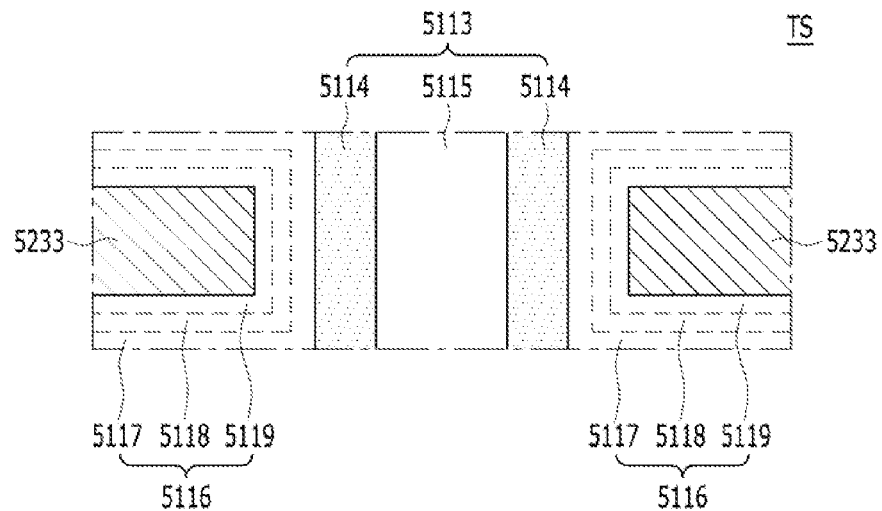

FIG. 7 is a cross-sectional of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer (e.g., an aluminum oxide layer, a hafnium oxide layer, etc.) that has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi may include a plurality of NAND strings NS which extend in a direction perpendicular to the substrate 5111 (e.g., the second direction) and may serve as a NAND flash memory block (e.g., of a charge capturing type memory) to which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 15 layers or any multiple of layers. In other words, in one NAND string NS, the number of transistors may be 8, 16 or more.

While it is illustrated in FIGS. 5 to 7 that 3 NAND strings N are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
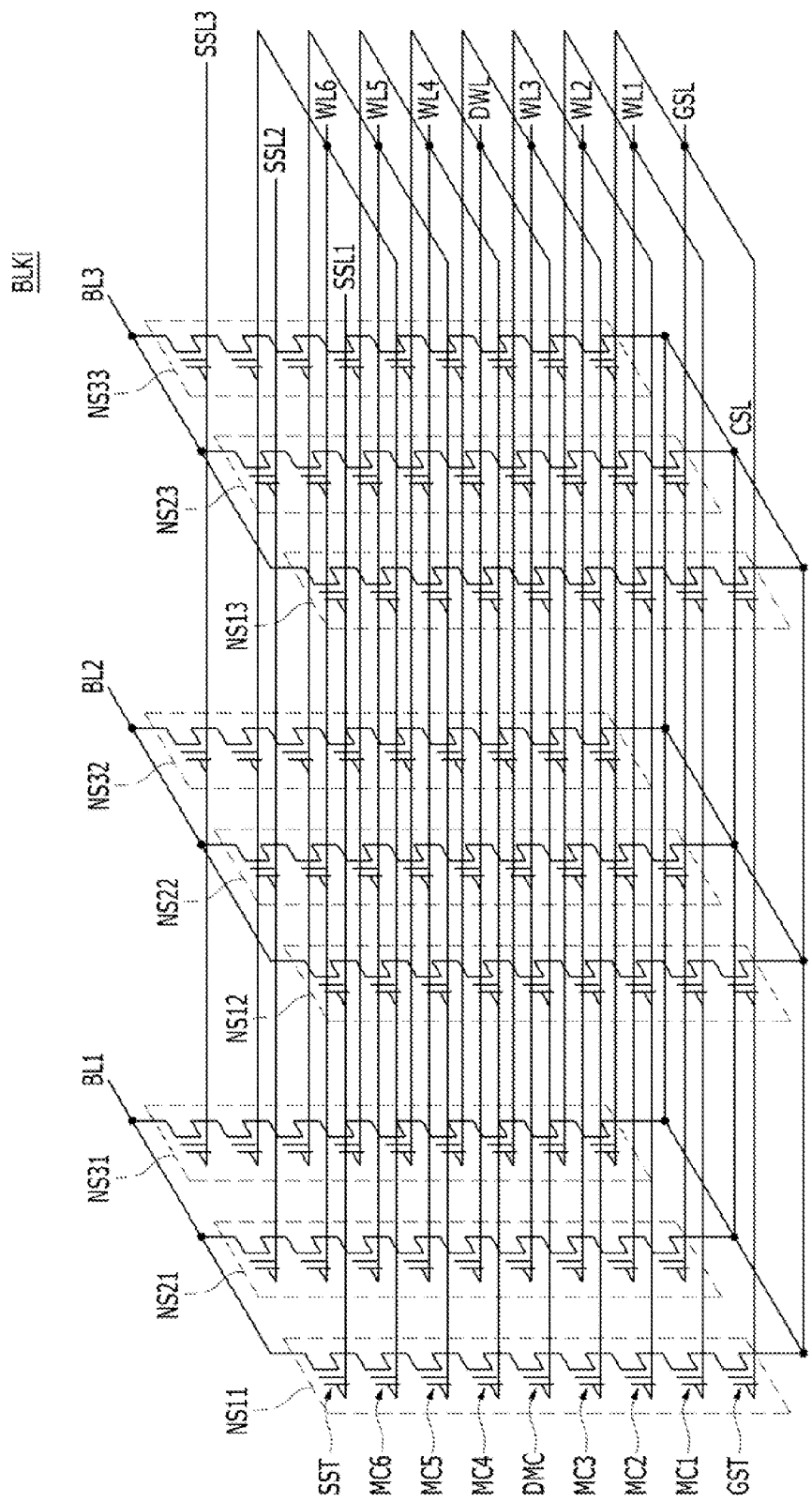

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS are defined by units of rows and columns and NAND strings NS which are electrically coupled to one bit line may form one column. The NAND strings NS11 to NS31 which are electrically coupled to the first bit line BL1 correspond to a first column, the NAND strings NS12 to NS32 which are electrically coupled to the second bit line BL2 correspond to a second column, and the NAND strings NS13 to NS33 which are electrically coupled to the third bit line BL3 correspond to a third column. NAND strings NS which are electrically coupled to one source select line SSL form one row. The NAND strings NS11 to NS13 which are electrically coupled to a first source select line SSL1 form a first row, the NAND strings NS21 to NS23 which are electrically coupled to a second source select line SSL2 form a second row, and the NAND strings NS31 to NS33 which are electrically coupled to a third source select line SSL3 form a third row.

In each NAND string NS, a height is defined. In each NAND string NS, the height of a memory cell MC1 adjacent to the ground select transistor GST has a value '1'. In each NAND string NS, the height of a memory cell increases as the memory cell gets closer to the source select transistor SST when measured from the substrate 5111. In each NAND string NS, the height of a memory cell MC6 adjacent to the source select transistor SST is 7.

The source select transistors SST of the NAND strings NS in the same row share the source select line SSL. The source select transistors SST of the NAND strings NS in different rows are respectively electrically coupled to the different source select lines SSL1, SSL2 and SSL3.

The memory cells at the same height in the NAND strings NS in the same row share a word line WL. That is, at the same height, the word lines WL electrically coupled to the memory cells MC of the NAND strings NS in different rows are electrically coupled. Dummy memory cells DMC at the same height in the NAND strings NS of the same row share a dummy word line DWL. Namely, at the same height or level, the dummy word lines DWL electrically coupled to the dummy memory cells DMC of the NAND strings NS in different rows are electrically coupled.

The word lines WL or the dummy word lines DWL located at the same level or height or layer are electrically coupled with one another at layers where the conductive materials 5211 to 5291, 5212 to 5292 and 5213 to 5293, which extend in the first direction, are provided. The conductive materials 5211 to 5291, 5212 to 5292 and 5213 to 5293 which extend in the first direction are electrically coupled in common to upper layers through contacts. At the upper layers, the conductive materials 5211 to 5291, 5212 to 5292 and 5213 to 5293 which extend in the first direction are electrically coupled. In other words, the ground select transistors GST of the NAND strings NS in the same row share the ground select line GSL. Further, the ground select transistors GST of the NAND strings NS in different rows share the ground select line GSL. That is, the NAND strings NS11 to NS13, NS21 to NS23 and NS31 to NS33 are electrically coupled to the ground select line GSL.

The common source line CSL is electrically coupled to the NAND strings NS. Over the active regions and over the substrate 5111, the first to fourth doping regions 5311 to 5314 are electrically coupled, The first to fourth doping regions 5311 to 5314 are electrically coupled to an upper layer through contacts and, at the upper layer, the first to fourth doping regions 5311 to 5314 are electrically coupled.

As shown in FIG. 8, the word lines WL of the same height or level are electrically coupled. Accordingly, when a word line WL at a specific height is selected, all NAND strings NS which are electrically coupled to the word line WL are selected. The NAND strings NS in different rows are electrically coupled to different source select lines SSL. Accordingly, among the NAND strings NS electrically coupled to the same word line WL, by selecting one of the source select lines SSL1 to SSL3 the NAND strings NS in the unselected rows are electrically isolated from the bit lines BL1 to BL3. In other words, by selecting one of the source select lines SSL1 to SSL3, a row of NAND strings NS is selected. Moreover, by selecting one of the bit lines BL1 to BL3, the NAND strings NS in the selected rows are selected in units of columns.

In each NAND string NS, a dummy memory cell DMC may be provided. In FIG. 8, the dummy memory cell DMC is provided between a third memory cell MC3 and a fourth memory cell MC4 in each NAND string NS. That is, first to third memory cells MC1 to MC3 are provided between the dummy memory cell DMC and the ground select transistor GST. Fourth to sixth memory cells MC4 to MC6 are provided between the dummy memory cell DMC and the source select transistor SST. The memory cells MC of each NAND string NS are divided into memory cell groups by the dummy memory cell DMC. In the divided memory cell groups, memory cells (e.g., MC1 to MC3) adjacent to the ground select transistor GST may be referred to as a lower memory cell group, and memory cells for example, MC4 to MC6, adjacent to the string select transistor SST may be referred to as an upper memory cell group.

Herein, detailed descriptions will be made with reference to FIGS. 9 to 11, which show the memory device in the memory system in accordance with an embodiment implemented with a three-dimensional (3D) nonvolatile memory device different from the first structure.

Figure 9:
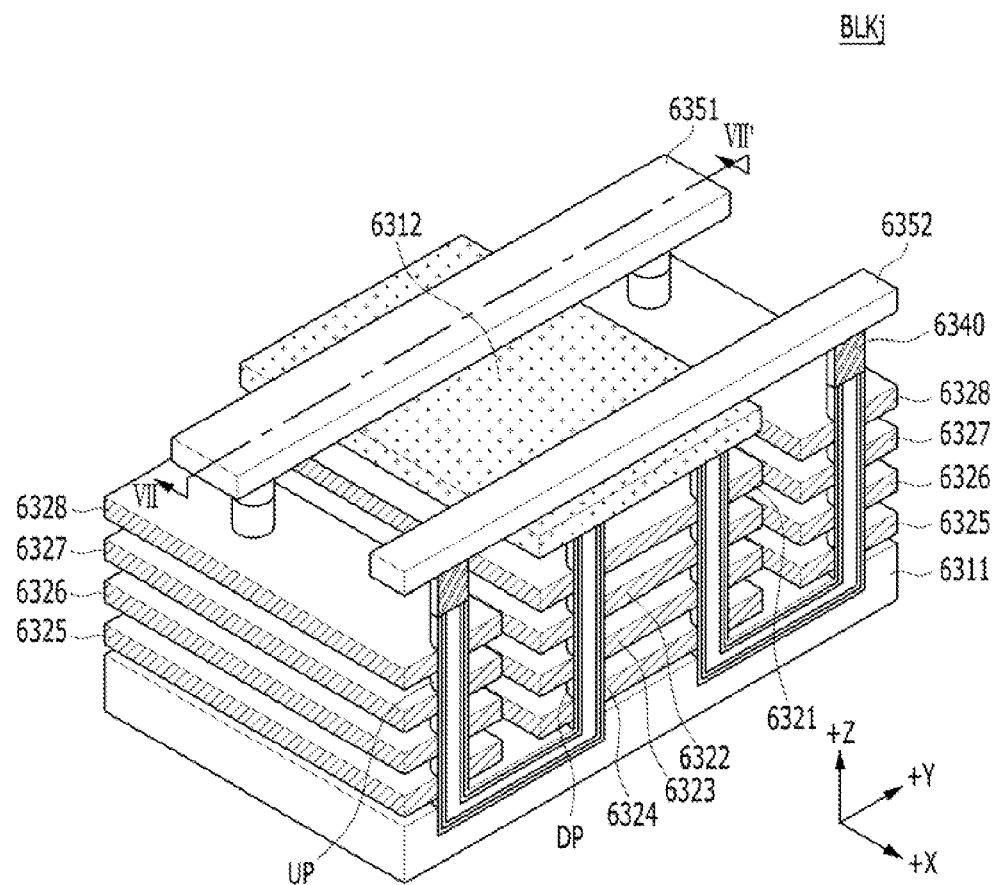

FIG. 9 is an isometric view schematically illustrating the memory device implemented with the three-dimensional (3D) nonvolatile memory device and showing a memory block BLKj of the plurality of memory blocks of FIG. 4. FIG. 10 is a cross-sectional view illustrating the memory block BLKj taken along the line VII-VII' of FIG. 9.

Figure 10:
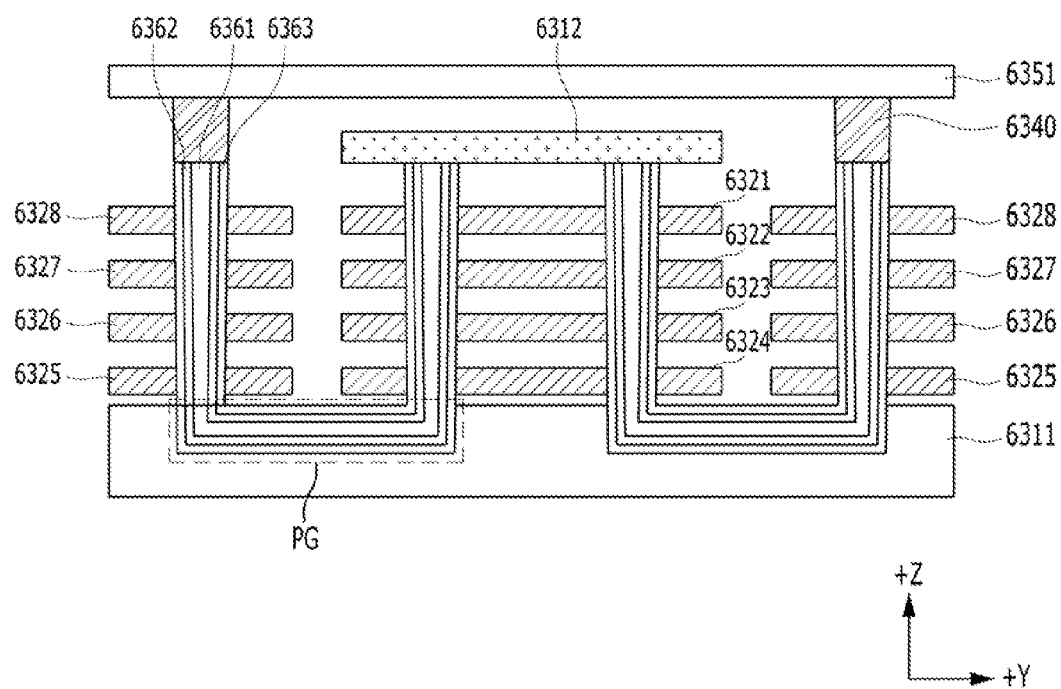

Referring to FIGS. 9 and 10, the memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well (e.g., a pocket p-well) and include an n-type well which surrounds the p-type well. While it is assumed in the embodiment that the substrate 6311 is p-type silicon, it is to be noted that the substrate 6311 is not limited to being p-type silicon.

First to fourth conductive materials 6321 to 6324 which extend in the x-axis direction and the y-axis direction may be provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10 the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
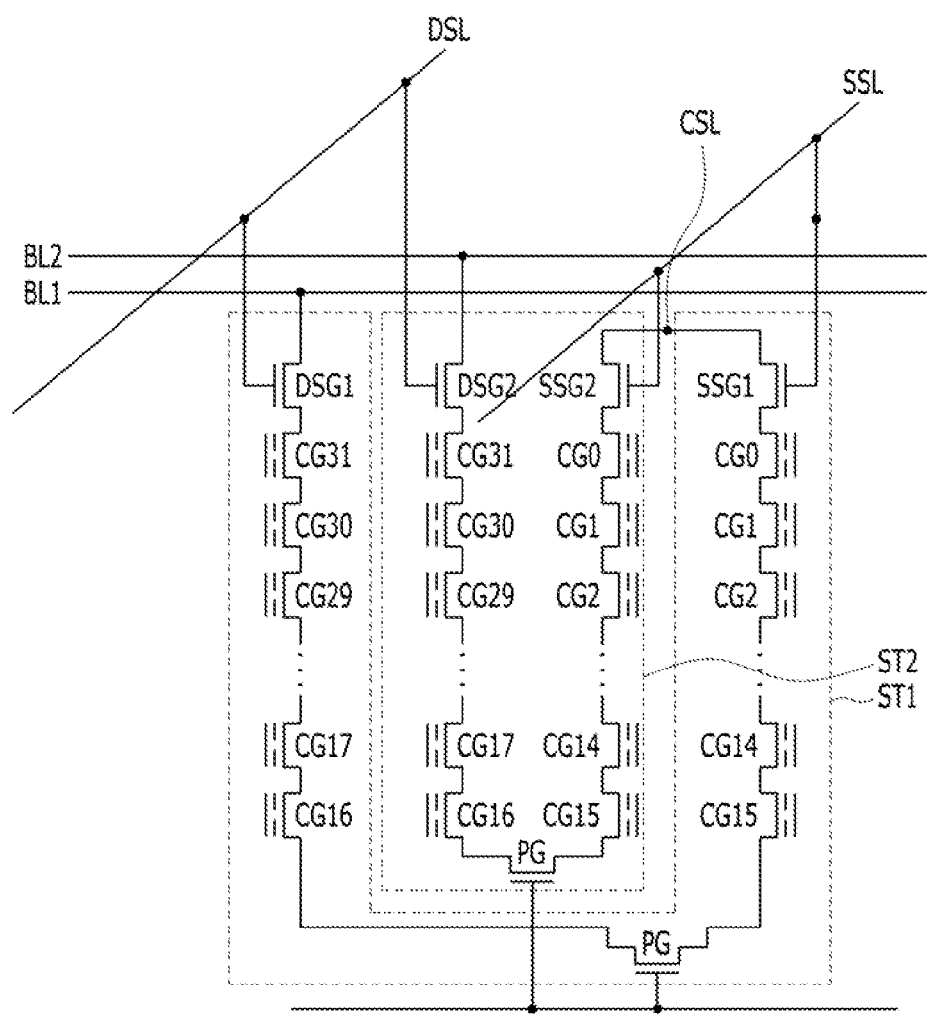

FIG. 11 is a circuit diagram illustrating the equivalent circuit of the memory block BLKj having the second structure as described above with reference to FIGS. 9 and 10. A first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, is provided in such a way as to define a plurality of pairs.

In the certain memory block BLKj having the second structure, memory cells CG0 to CG31 stacked along a first channel CH1 (not shown) (e.g., at least one source select gate SSG1 and at least one drain select gate DSG1) form a first string ST1, and memory cells CG0 to CG31 stacked along a second channel CH2 (not shown) (e.g., at least one source select gate SSG2 and at least one drain select gate DSG2) form a second string ST2.

The first string ST1 and the second string ST2 are electrically coupled to the same drain select line DSL and the same source select line SSL. The first string ST1 is electrically coupled to a first bit line BL1, and the second string ST2 is electrically coupled to a second bit line BL2.

While it is described in FIG. 11 that the first string ST1 and the second string ST2 are electrically coupled to the same drain select line DSL and the same source select line SSL, it is contemplated that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it is contemplated that the first string ST1 and the second string ST2 may be electrically coupled to the same drain select line DSL and the same bit line BL, the first string ST1 may be electrically coupled to a first source select line SSL1 and the second string ST2 may be electrically coupled a second source select, line SSL2.

Figure 12:
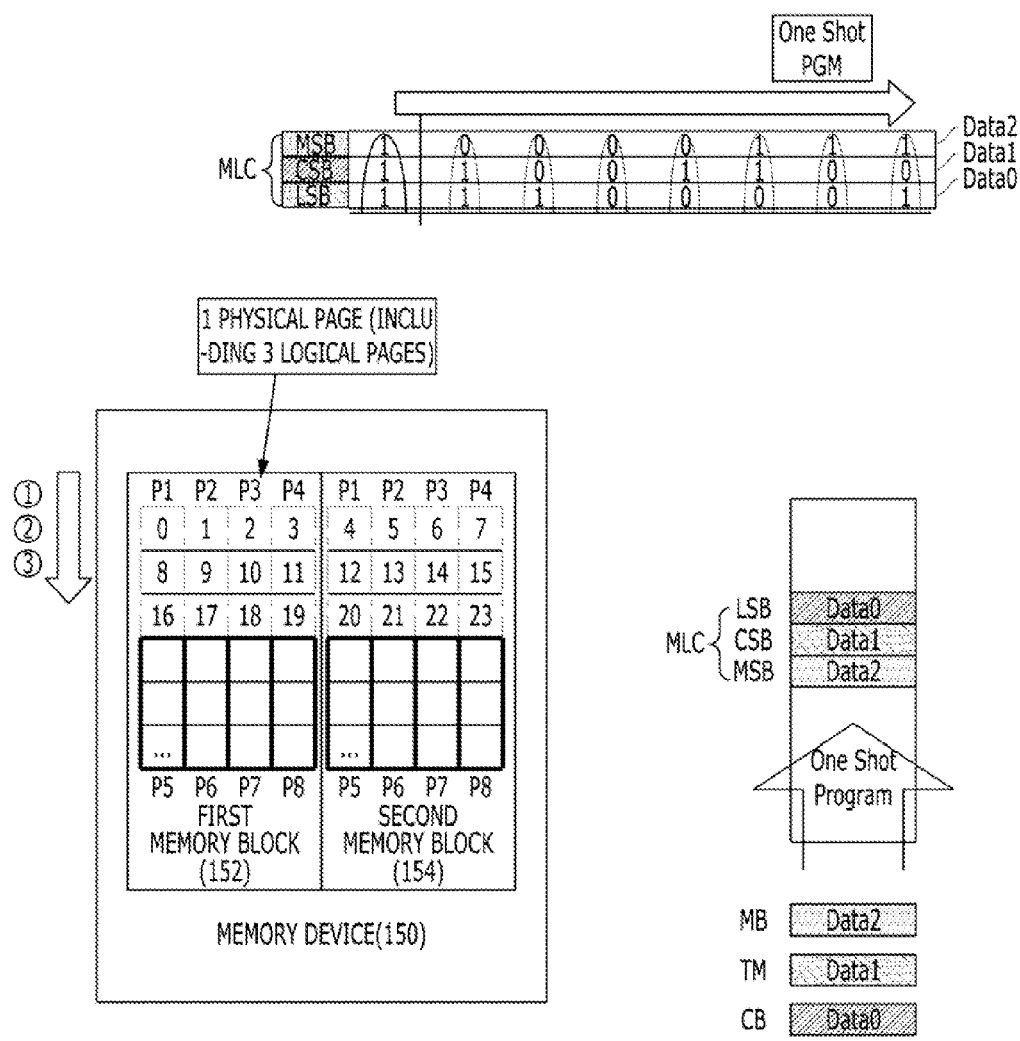
FIG. 12 is a schematic diagram illustrating a one shot program operation for a multi-level cell of a memory system in accordance with an embodiment.

FIG. 12 is a schematic diagram illustrating the one shot program operation for a multi-level cell of a memory system in accordance with an embodiment.

FIG. 12 shows the first and second memory blocks 152 and 154 among the plurality of memory blocks 152, 154 and 156 included in the memory device 150. Each of the first and second memory blocks 152 and 154 may include a plurality of pages P<1:8>. Each of the first and second memory blocks 152 and 154 includes a plurality of memory cells.

Each of the plurality of memory cells is a mufti-level cell MLC capable of storing 3-bit data Data<0:2> at a time. It is to be noted that each of the plurality of memory cells may be set as a multi-level cell MLC having a grade higher than a triple-level cell, such as a quad-level cell, a hexa-level cell or an octa-level cell.

The memory system in accordance with the embodiment supports a one shot program operation. In other words, the memory system supports an operation of simultaneously programming 3-bit data Data<0:2> in the multi-level cell MLC through a single program operation.

In order to temporarily store data Data2 as the MSB of the multi-level cell MLC, data Data1 as the CSB of the multi-level cell MLC and data Data0 as the LSB of the multi-level cell MLC through the one shot program operation, 3 latches MB, CB and TM are included in the memory device 150.

A program period of the one shot program operation is divided into a preceding first half program period and a following second half program period. During the first half program period, the 3-bit data Data<0:2> sequentially inputted from the host 102 are respectively stored in the 3 latches MB, CB and TM. During the second half program period following the first half program period, the 3-bit data Data<0:2> respectively stored in the 3 latches MB, CB and TM are sequentially programmed in the 3-bit multi-level cell MLC.

When the 3-bit data Data<0:2> are programmed in the multi-level cell MLC at a time, a read operation should be performed three times to read three values of the 3-bit data Data<0:2> respectively stored as MSB, CSB, and LSB of the multi-level cell MLC.

Referring to FIG. 12, groups of 3 logical pages (shown as {0, 8, 16}, {1, 9, 17}, {2, 10, 18}, {3, 11, 19}, . . . in FIG. 12) respectively correspond to physical pages P<1:8> included in the first memory block 152, and groups of 3 logical pages (shown as {4, 12, 20}, {5, 13, 21}, {6, 14, 22}, {7, 15, 23}, . . . in FIG. 12) respectively correspond to physical pages P<1:8> included in the second memory block 154.

Figure 13A:
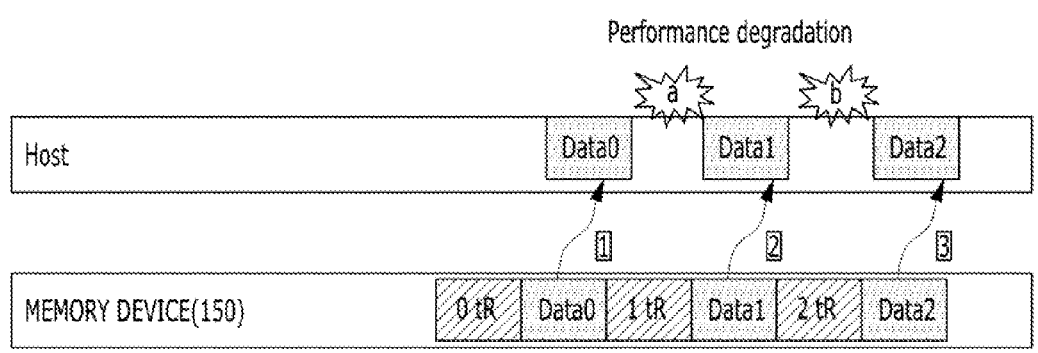
FIG. 13A is a schematic diagram illustrating a normal read operation of a memory system.

FIG. 13A is a schematic diagram illustrating a normal read operation of a memory system. FIG. 13A illustrates the normal read operation for the multi-bit data programmed in the multi-level cell MLC through the one shot program operation the memory system.

Referring to FIG. 13A, three normal read operations 0tR, 1tR and 2tR should be successively performed for read-out of three values of stored data D<0:2> in the multi-level cell MLC.

When the normal read operation is performed in the multi-level cell MLC, three data output operations 1, 2 and 3 are performed respectively after the three read operations 0tR, 1tR and 2tR. For example, the first data output operation 1 is performed after the first read operation 0tR, the second data output operation 2 is performed after the second read operation 1tR, and the third data output operation 3 is performed after the third read operation 2tR.

The host 120 receiving the output data has idle times (shown as "a" and "b" in FIG. 13) between the three read operations 0tR, 1tR and 2tR for receiving each of output data D<0:2>.

The idle times mean that a time required to output data is long correspondingly and thus the performance of the memory device 150 is degraded.

Figure 13B:
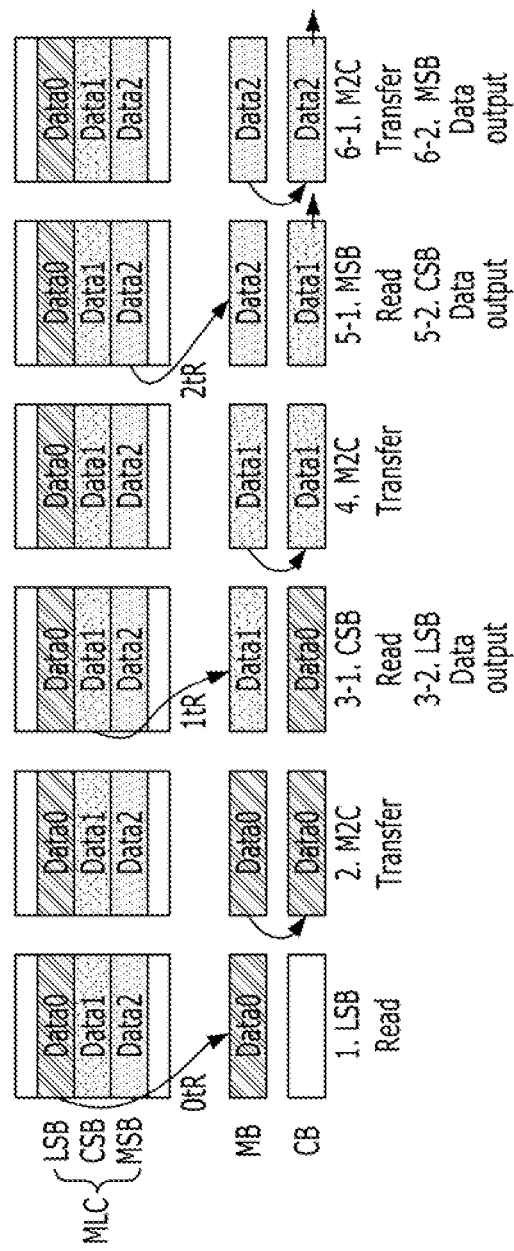
FIGS. 13B and 13C are schematic diagrams illustrating a cache read operation of a memory system.
Figure 13C:
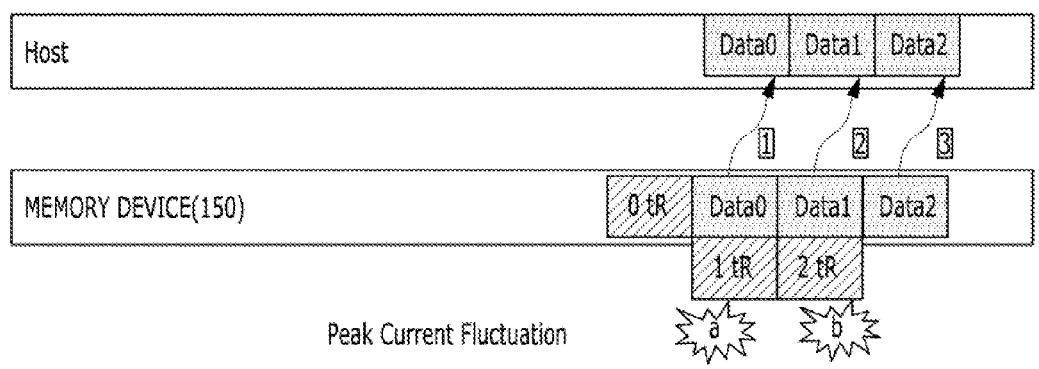

FIGS. 13B and 13C are schematic diagrams illustrating a cache read operation of a memory system. FIGS. 13B and 13C show the cache read operation for the multi-bit data programmed in each multi-level cell through the one shot program operation in a memory system.

Referring to FIG. 13B, the multi-level cell MLC stores 3 bit-data D<0:2> as the LSB, CSB and MSB. A main latch MB and a cache latch CB are included in the memory device 150 to support the cache read operation. The main latch MB is electrically coupled to the multi-level cell MLC, and sequentially latches by a single bit basis the 3-bit data Data<0:2> stored in the multi-level cell MLC. The cache latch CB is electrically coupled to an input/output circuit (not shown), and sequentially latches by a single bit basis the 3-bit data Data<0:2> to be inputted/outputted to/from an input/output circuit.

The cache read operation is performed in the following order.

The data Data0 stored as the LSB among the stored 3-bit data Data<0:2> in the multi-level cell MLC is latched to the main latch MB (shown as "1. LSB Read" in FIG. 13B).

The data Data0 latched in the main latch MB is moved to the cache latch CB (shown as "2. M2C Transfer" in FIG. 13B).

The data Data1 stored as the CSB among the stored 3-bit data Data<0:2> in the multi-level cell MLC is latched to the main latch MB (shown as "3-1. CSB Read" in FIG. 13B) while the data Data0 latched in the cache latch CB is outputted to the host 102 (shown as "3-2. LSB Data output" in FIG. 13B).

The data Data1 latched in the main latch MB is moved to the cache latch CB (shown as "4. M2C Transfer" in FIG. 13B).

The data Data2 stored as the MSB among the 3-bit data Data<0:2> in the multi-level cell MLC is latched to the main latch MB (shown as "5-1. MSB Read" in FIG. 13B) while the data Data1 latched in the cache latch CB is outputted to the host 102 (shown as "5-2. CSB Data output" in FIG. 13B).

The data Data2 latched in the main latch MB is moved to the cache latch CB (shown as "6-1. M2C Transfer" in FIG. 13B), and the data Data2 latched in the cache latch CB is outputted to the host 102 (shown as "6-2. MSB Data output" in FIG. 13B).

In the above-described cache read operation, the operations of reading the 3-bit data Data<0:2> from the mufti-level cell MLC through the main latch MB and the operations of outputting the 3-bit data Data<0; 2> through the cache latch CB are simultaneously performed.

FIG. 13C shows the peak current fluctuation phenomenon due to the cache read operation shown in FIG. 13S.

Referring to FIG. 13C, during the cache read operation, the first read operation 0tR does not overlap with the three data output operations 1, 2 and 3 while the second read operation 1tR overlaps with the first data output operation 1 (shown as "a" in FIG. 13C) and the third read operation 2tR overlaps with the second data output operation 2 (shown as "b" in FIG. 13C).

In this way, during the cache read operation, the overlap of the read operation and the output operation causes the surge of current for the data read operation.

FIG. 13D is a schematic diagram illustrating the normal read operation and the cache read operation of a memory system. FIG. 13D illustrates in detail the normal read operation and the cache read operation described in FIGS. 13A to 13C.

In detail, as described above with reference to FIGS. 13A and 13B, in order to read the 3-bit data Data<0:2> from the multi-level cell MLC through the normal read operation and the cache read operation, three read operations 0tR, 1tR and 2tR should be performed. In this regard, because the normal and cache read operations are performed in such a manner that the operation of reading data and the operation of outputting data is alternately performed, a read preparation operation is needed each time each of the 3-bit data Data<0:2> stored in the multi-level cell MLC is read, as shown in FIG. 13D.

The read preparation operation shown in FIG. 13D includes various operations needed as the operational steps of a circuit for reading the 3-bit data Data<0:2> from the multi-level cell MLC. For example, the read preparation operation includes initialization and setting operations (shown as "Initial Data Setting", "Common Setting" in FIG. 13C), a decoder operation (shown as "XDEC" in FIG. 13C), voltage generation operations (shown as "PUMP on", and PUMP in FIG. 13C), and so forth.

Figure 14:
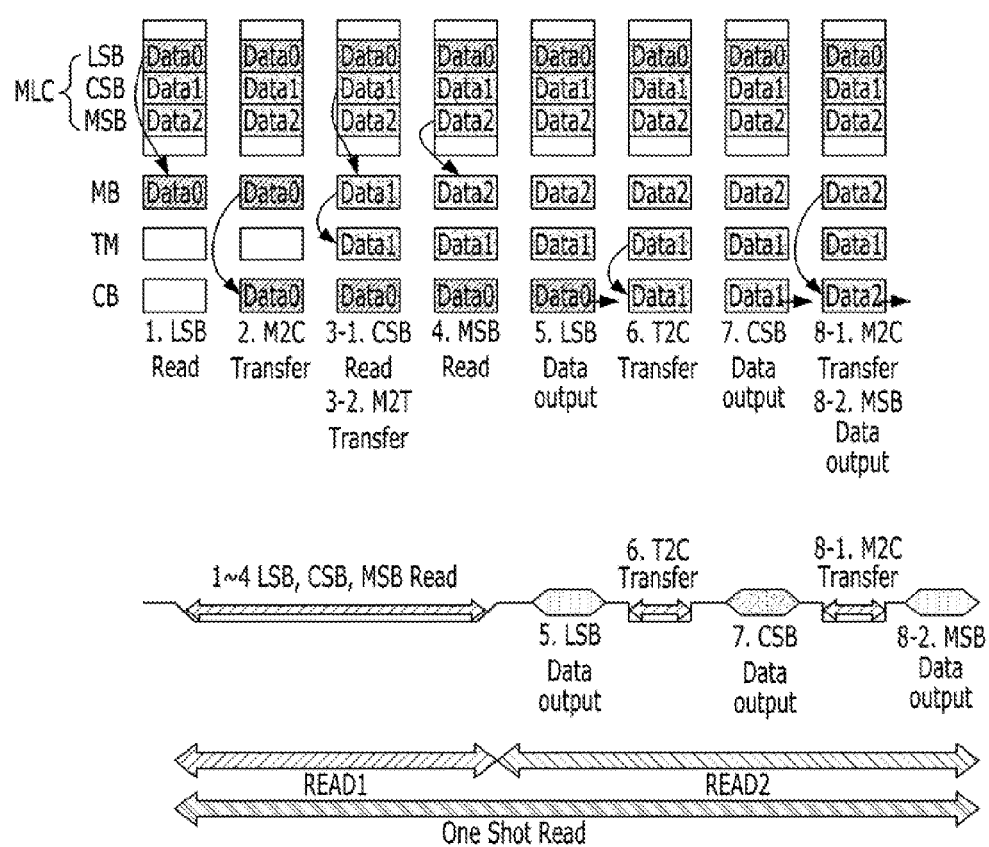
FIG. 14 is a schematic diagram illustrating a one shot read operation of a memory system in accordance with an embodiment of the present invention.

FIG. 14 is a schematic diagram illustrating a one shot read operation of the memory system in accordance with an embodiment of the present invention. FIG. 14 shows a one shot read operation for the multi-bit data programmed in the multi-level cell MLC through the one shot program operation in the memory system in accordance with an embodiment of the present invention.

Referring to FIG. 14, the multi-level cell MLC stores 3 bit-data D<0:2> as the LSB, CSB and MSB. A main latch MB, a cache latch CB, and an auxiliary latch TM are included in the memory device 150 to support the one shot read operation. The main latch MB is electrically coupled to the multi-level cell MLC, and sequentially latches by a single bit basis the 3-bit data Data<0:2> stored in the multi-level cell MLC. The cache latch CB is electrically coupled to an input/output circuit (not shown), and sequentially latches by a single bit basis the 3-bit data Data<0:2> to be inputted/outputted to/from the input/output circuit. The auxiliary latch TM is electrically coupled between the main latch MB and the cache latch CB, and latches one of 3-bit data DATA<0:2> latched in the main latch MB or the cache latch.

In accordance with an embodiment of the present invention, the 3 latches MB, CB and TM for the one shot program operation described with reference to FIG. 12 are also used for the one shot read operation.

Similarly, M number of latches (not shown) are needed to store M-bit data in a multi-level cell at a time. The M number of latches may include a single main latch MB and a single cache latch CB each for storing 1-bit data, and M−2 number of auxiliary latches TM for storing (M−2)-bit data. M may be an integer equal to or greater than 3. For example, in the case of a quad-level cell (QLC) in which 4-bit data is stored at a time, 4 latches are needed to store the 4-bit data at a time through the one shot read operation and the one shot program operation.

The read period of the one shot read operation includes a preceding first half read period READ1 and a following second half read period READ2.

During the first half read period READ1, only an operation of reading the 3-bit data Data<0:2> stored in the multi-level cell MLC is performed.

During the first half read period READ1, the 3-bit data Data<0:2> are read in the following order.

The data Data0 stored as the LSB among the 3-bit data Data<0:2> stored in the multi-level cell MLC is latched to the main latch MB (shown as "1. LSB Read" in FIG. 14, the data Data0 latched in the main latch MB is moved to the cache latch CB (shown as "2. M2C Transfer" in FIG. 14).

The data Data1 stored as the CSB among the 3-bit data Data<0:2> stored in the multi-level cell MLC is latched to the main latch MB (shown as "3-1. CSB Read" in FIG. 14), and the data Data1 latched in the main latch MB is move to the auxiliary latch TM (shown as "3-2. M2T Transfer" in FIG. 14).

The data Data2 stored as the MSB among the 3-bit data Data<0:2> stored in the multi-level cell MLC is latched to the main latch MB (shown as "4. MSB Read" in FIG. 14).

When all of the 3-bit data Data<0:2> stored in the multi-level cell MLC are respectively latched to the 3 latches MB, CB and TM during the first half read period READ1, the second half read period READ2 starts.

During the second half read period READ2, only an operation of outputting the 3-bit data Data<0:2>, which are latched in the 3 latches MB, CB, and TB, to the host 102 is performed.

During the second half read period READ2, the 3-bit data Data<0:2> is outputted in the following order.

The data Data0 latched in the cache latch CB is outputted to the host 102 through the input/output circuit (shown as "5. LSB Data output" in FIG. 14), and the data Data1 latched in the auxiliary latch TM is moved to the cache latch CB (shown as "6. T2C Transfer" in FIG. 14).

The data Data1 latched in the cache latch CB is outputted to the host 102 through the input/output circuit (shown as "7. CSB Data output" in FIG. 14), and the data Data2 latched in the main latch MB is moved to the cache latch CB (shown as "8-1. M2C Transfer" in FIG. 14).

The data Data2 latched in the cache latch CB is outputted to the host 102 through the input/output circuit (shown as "8-2. MSB Data output" in FIG. 14).

As described above, the 3-bit data Data<0:2> latched to the 3 latches MB, CB and TM during the first half read period READ1 is outputted to the host 102 during the second half read period READ2.

As described above, during the first half read period READ1, only the operation of reading the 3-bit data Data<0:2> stored in the multi-level cell MLC to the 3 latches MB, CB and TM is performed, and, during the second half read period READ2, only the operation of outputting the 3-bit data Data<0:2> latched in the 3 latches MB, CB and TM, to the host 102 is performed. Accordingly, unlike the case of the cache read operation described above with reference to FIGS. 13B and 13C, abruptly fluctuating peak current does not occur.

Figure 15A:
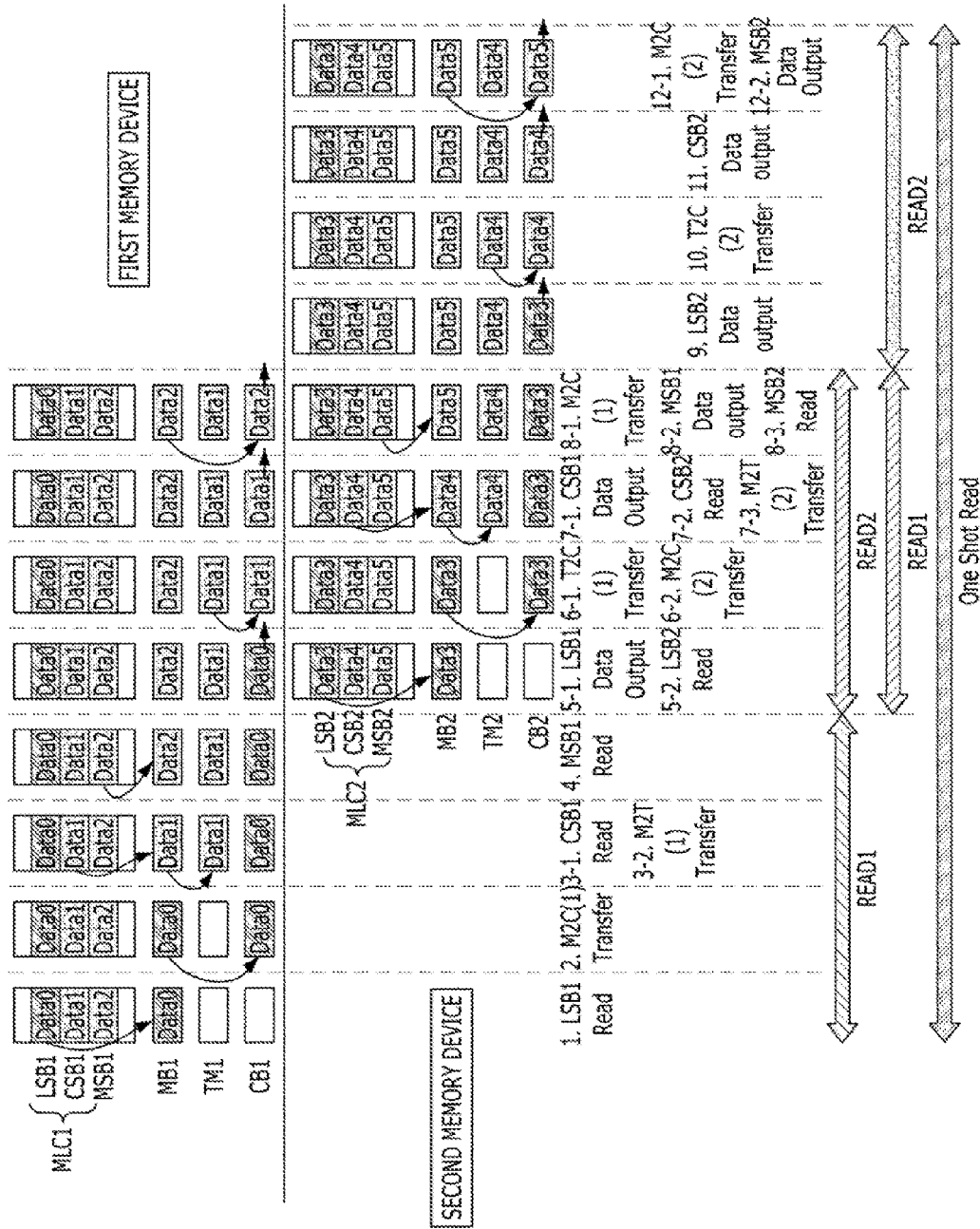
FIGS. 15A and 15S are schematic diagrams illustrating a one shot read operation of a memory system in accordance with an embodiment of the present invention.
Figure 15B:
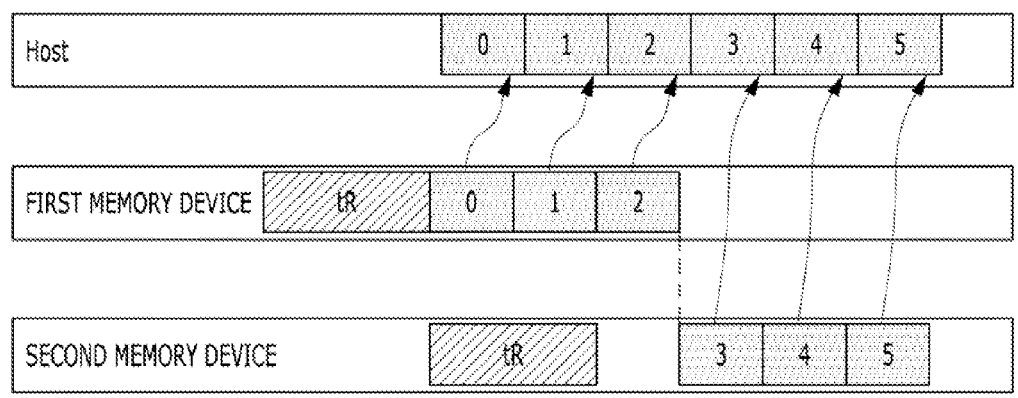

FIGS. 15A and 15B are schematic diagrams illustrating a one shot read operation of the memory system in accordance with an embodiment of the present invention. FIGS. 15A and 15B show the one shot read operation for the multi-bit data programmed in each multi-level cell through the one shot program operation in the memory system having a plurality of memory devices in accordance with an embodiment of the present invention.

Each memory device may be similar to the memory device described with reference to FIG. 14.

The memory cells respectively included in the first memory device and the second memory device are multi-level cells MLC1 and MLC2 in which 3-bit data Data<0:2> and Data<3:5> is stored at a time through the one shot program operation as described above with reference to FIG. 12.

Referring to FIG. 15A, the multi-level cell MLC1 stores 3 bit-data D<0:2> as the LSB1, CSB1 and MSB1 in a first memory device. A main latch MB1, a cache latch CB1, and an auxiliary latch TM1 are included in the first memory device to support the one shot read operation. Also, the multi-level cell MLC2 stores 3 bit-data D<3:5> as the LSB2, CSB2 and MSB2 in a second memory device. A main latch MB2, a cache latch CB2, and an auxiliary latch TM2 are included in the second memory device to support the one shot read operation. The main latches MB1 and MB2, the cache latches CB1 and CB2, and the auxiliary latches TM1 and TM2 are respectively the same as the main latch MB, cache latch CB, and auxiliary latch TM described with reference to FIG. 14.

In accordance with an embodiment of the present invention, the 3 latches MB, CB and TM for the one shot program operation described with reference to FIG. 12 are also used as each group of the 3 latches MB1, CB1 and TM1 and MB2, CB2 and TM2 for the one shot read operation of the first and second memory devices.

Similarly, M number of latches (not shown) are needed to store M-bit data in a multi-level cell at a time in each of the first and second memory devices, as described with reference to FIG. 14. The M number of latches in each of the first and second memory devices may include a single main latch MB and a single cache latch CB each for storing 1-bit data, and M−2 number of auxiliary latches TM for storing (M−2)-bit data. M may be an integer equal to or greater than 3. For example, in the case of a quad-level cell (QLC) in which 4-bit data is stored at a time, 4 latches are needed to store the 4-bit data at a time through the one shot read operation and the one shot program operation.

Each of the first and second memory devices performs the one shot read operation during the first and second half read periods READ1 and READ2 as described with reference to FIG. 14. In accordance with an embodiment of the present invention, the first and second memory devices perform the one shot read operations in the pipelining way. When assuming that the operation of the first memory device comes first and the operation of the second memory device comes later, the second half read period READ2 of the first memory device and the first half read period READ1 of the second memory device overlap with each other.

During the first half read period READ1 of the first memory device, the 3-bit data Data<0:2> is read in the following order.

The data Data0 stored as the LSB1 among the 3-bit data Data<0:2> stored in the multi-level cell MLC is latched to the main latch MB1 (shown as "1. LSB1 Read" in FIG. 15A), and the data Data0 latched in the main latch MB1 is moved to the cache latch CB1 (shown as "2. M2C (1) Transfer" in FIG. 15A).

The data Data1 stored as the CSB1 among the 3-bit data Data<0:2> stored in the mufti-level cell MLC is latched to the main latch MB1 (shown as "3-1 CSB1 Read" in FIG. 15A), and the data Data1 latched in the main latch MB1 is move to the auxiliary latch TM1 (shown as "3-2. M2T (1) Transfer" in FIG. 15A).

The data Data2 stored as the MSB1 among the 3-bit data Data<0:2> stored in the multi-level cell MLC is latched to the main latch MB1 (shown as "4. MSB1 Read" in FIG. 15A).

When all of the 3-bit data Data<0:2> stored in the multi-level cell MLC are respectively latched to the 3 latches MB1, CB1 and TM1 during the first half read period READ1 of the first memory device, the second half read period READ2 of the first memory device and the first half read period READ1 of the second memory device concurrently start.

During the second half read period READ2 of the first memory device and the first half read period READ1 of the second memory device, the 3-bit data Data<0:2> is outputted in the following order.

The data Data0 latched in the cache latch CB1 is outputted to the host 102 through the input/output circuit (shown as "5-1. LSB1 Data output" in FIG. 15A), and the data Data1 latched in the auxiliary latch TM1 is moved to the cache latch CB1 (shown as "6-1. T2C (1) Transfer" in FIG. 15A).

The data Data1 latched in the cache latch CB1 is outputted to the host 102 through the input/output circuit (shown as "7-1. CSB1 Data output" in FIG. 15A), and the data Data2 latched in the main latch MB1 is moved to the cache latch CB1 (shown as "8-1. M2C (1) Transfer" in FIG. 15A).

The data Data2 latched in the cache latch CB1 is outputted to the host 102 through the input/output circuit (shown as "8-2. MSB1 Data output" in FIG. 15A).

Also, during the second half read period READ2 of the first memory device and the first half read period READ1 of the second memory device, the 3-bit data Data<3:5> is outputted in the following order.

The data Data3 stored as the LSB2 among the 3-bit data Data<3:5> stored in the multi-level cell MLC is latched to the main latch MB2 (shown as "5-2. LSB2 Read" in FIG. 15A), and the data Data3 latched in the main latch MB2 is moved to the cache latch CB2 (shown as "6-2. M2C (2) Transfer" in FIG. 15A).

The data Data4 stored as the CSB2 among the 3-bit data Data<3:5> stored in the multi-level cell MLC is latched to the main latch MB2 (shown as "7-2. CSB2 Read" in FIG. 15A) and the data Data4 latched in the main latch MB2 is moved to the auxiliary latch. TM2 (shown as "7-3. M2T (2) Transfer" in FIG. 15A).

The data Data5 stored as the MSB2 among the 3-bit data Data<3:5> stored in the multi-level cell MLC is latched to the main latch MB2 (shown as "8-3. MSB2 Read" in FIG. 15A).

When all of the 3-bit data Data<3:5> stored in the multi-level cell MLC are respectively latched to the 3 latches MB2, CB2 and TM2 during the first half read period READ1 of the second memory device, the second half read period READ2 of the second memory device starts.

During the second half read period READ2 of the second memory device, the 3-bit data Data<3:5> is outputted in the following order.

The data Data3 latched in the cache latch CB2 is outputted to the host 102 through the input/output circuit (shown as "9. LSB2 Data output" in FIG. 15A), and the data Data4 latched in the auxiliary latch TM2 is moved to the cache latch CB2 (shown as "10. T2C (2) Transfer" in FIG. 15A).

The data Data4 latched in the cache latch CB2 is outputted to the host 102 through the input/output circuit (shown as "11. CSB2 Data output" in FIG. 15A), and the data Data5 latched in the main latch MB2 is moved to the cache latch CB2 (shown as "12-1. M2C (2) Transfer" in FIG. 15A).

The data Data5 latched in the cache latch CB2 is outputted to the host 102 through the input/output circuit (shown as "12-2. MSB2 Data output" in FIG. 15A).

As described above, in the pipelining way, the 3-bit data Data<0:2> latched to the 3 latches MB1, CB1 and TM1 during the first half read period READ1 is outputted to the host 102 during the second half read period READ2 by the first memory device while the 3-bit data Data<3:5> latched to the 3 latches MB2, CB2 and TM2 during the first half read period READ1 is outputted to the host 102 during the second half read period READ2 by the second memory device. Accordingly, the abruptly fluctuating peak current does not occur in each of the first and second memory devices as described with reference to FIG. 14.

Referring to FIG. 15B, when the one shot read operation is performed in the memory system including the first memory device and the second memory device, since the one shot read operations of the first memory device and the second memory device in the pipelining way, the abrupt fluctuation of peak current does not occur in each of the first memory device and the second memory device and The 3-bit data Data<0:2> of the first memory device and the 3-bit data Data<3:5> of the second memory device are ceaselessly provided to the host 102.

For reference, while it, vas described as an example in FIGS. 15A and 15B that the first memory device and the second memory device are included in the memory system, it is contemplated that an increased number of memory devices may be included in the memory system. For example, in the case where a first memory device, a second memory device and a third memory device are included in the memory system, because setting will be made in such a way that a period in which the operation of outputting data is performed in the second memory device and a period in which the operation of reading data is performed in the third memory device overlap with each other, the one shot read operations performed in the first memory device, the second memory device and the third memory device may be performed in a continuously connected pattern.

FIG. 16 is a schematic diagram illustrating the one shot read operation of the memory system in accordance with an embodiment of the present invention. FIG. 16 illustrates in detail the one shot read operation described in FIGS. 14, 15A and 15B.

As described above with reference to FIG. 14, even during the one shot read operation, operations for reading data three times by a single bit basis are required. However, since the operations of reading the 3-bit data Data<0:2> and Data<3:5> are consecutively performed during only the first half read period READ1 and the other operations are not performed during the first half read period READ1 of each of the first and second memory devices, it is possible to read all the 3-bit data Data<0:2> with performing the read preparation operation in each of the first and second memory device once, as shown in FIG. 16.

The read preparation operation shown in FIG. 16 includes various operations needed as the operational steps of a circuit when reading the 3-bit data Data<0:2> and Data<3:5> from the first and second multi-level cells MLC1 and MLC2. For example, the read preparation operation includes initialization and setting operations (shown as "Initial Data Setting", "Common Setting" in FIG. 16), a decoder operation (shown as "XDEC" in FIG. 16), voltage generation operations (shown as "PUMP on", and "PUMP" in FIG. 16) and so forth.

In the embodiments, a read period of a single read operation for a memory device including a multi-level cell is divided into a preceding first half read period and a following second half read period, only an operation of reading out the multi-bit data stored in the multi-level cell into a plurality of latches is performed during the first half read period, and only an operation of outputting the multi-bit data stored in the plurality of latches to a host is performed during the second half read period. Therefore, it is possible to read all the multi-bit data of the multi-level cell through a single read operation.

Also, due to the separation of the first half read period for the read operation and the second half read period for the output operation, the amount of peak current produced during the read operation may be reduced.

Further, in a memory system including at least two memory devices, the one shot read operations of the respective memory devices may be performed in the pipelining way and therefore the host seamlessly receives data from the plural memory devices.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory system comprising:
   a nonvolatile memory device including a multi-level cell which stores M-bit data, M being an integer equal to or greater than 3, at a time and M number of latches for respectively storing M-bit data on a single bit basis; and
   a controller suitable for sequentially latching M-bit data of the multi-level cell into the M number of latches, respectively, during a first half read period, and sequentially outputting the latched M-bit data in the M number of latches during a second half read period,
   wherein the M number of latches comprise:
   a main latch suitable for latching each of the M-bit data to be inputted/outputted to/from the multi-level cell;
   a cache latch suitable for latching each of the M-bit data to be inputted/outputted to/from an input/output circuit; and
   M minus 2 number of auxiliary latches electrically suitable for latching one of bits of the M-bit data latched in the main latch or the cache latch,
   wherein, during the first half read period, the controller sequentially latches each of M-bit data into the main latch on a single bit basis, and latches each of the M-bit data, which is previously latched in the main latch, into one of the cache latch and the M minus 2 number of auxiliary latches, and
   wherein the controller sequentially outputs the latched M-bit data in the M number of latches during the second half read period after all M-bit data are latched in the M number of latches.

2. The nonvolatile memory system according to claim 1, wherein the controller latches M-bit data provided from a host into the M number of latches, respectively, during a first half program period, and sequentially programs the latched M-bit data in the M number of latches into the multi-level cell during a second half program period.

3. The nonvolatile memory system according to claim 1, wherein, during the second half read period, the controller moves each of the M-bit data latched in one of the main latch and the M minus 2 number of auxiliary latches to the cache latch on a single bit basis each time each of the M-bit data previously latched in the cache latch is outputted through the input/output circuit, thereby sequentially outputting the total M-bit data through the input/output circuit on a single bit basis.

4. A method for operating a nonvolatile memory system having a nonvolatile memory device including a multi-level cell which stores M-bit data, M being an integer equal to or greater than 3, at a time and M number of latches for respectively storing M-bit data on a single bit basis, the method comprising:
   sequentially latching M-bit data of the multi-level cell into the M number of latches, respectively, during a first half read period; and
   sequentially outputting the latched M-bit data in the M number of latches during a second half read period,
   wherein the M number of latches comprise:
   a main latch suitable for latching each of the M-bit data to be inputted/outputted to/from the multi-level cell;
   a cache latch suitable for latching each of the M-bit data to be inputted/outputted to/from an input/output circuit; and
   M minus 2 number of auxiliary latches electrically suitable for latching one of bits of the M-bit data latched in the main latch or the cache latch,
   wherein the sequentially latching during the first half read period sequentially latches each of M-bit data into the main latch on a single bit basis, and latches each of the M-bit data, which is previously latched in the main latch, into one of the cache latch and the M minus 2 number of auxiliary latches, and
   wherein the sequentially outputting during the second half read period is performed after all M-bit data is latched in the M number of latches.

5. The method according to claim 4, further comprising:
   latching M-bit data provided from a host into the M number of latches, respectively, during a first half program period and
   sequentially programming the latched M-bit data in the M number of latches into the multi-level cell during a second half program period.

6. The method according to claim 4, wherein the sequentially outputting during the second half read period moves each of the M-bit data latched in one of the main latch and the M minus 2 number of auxiliary latches to the cache latch on a single bit basis each time each of the M-bit data previously latched in the cache latch is outputted through the input/output circuit, thereby sequentially outputting the total M-bit data through the input/output circuit on a single bit basis.

* * * * *